United States Patent
Staudt

(10) Patent No.: US 10,375,823 B2
(45) Date of Patent: Aug. 6, 2019

(54) DIFFERENTIAL SIGNAL TRACES INCLUDING A SOLDER MASK DISPOSED THEREON

(71) Applicant: FCI USA LLC, Etters, PA (US)

(72) Inventor: Benjamin Reed Staudt, Harrisburg, PA (US)

(73) Assignee: FCI USA LLC, Etters, PA (US)

(*) Notice: Subject to any disclaimer, the term of this patent is extended or adjusted under 35 U.S.C. 154(b) by 0 days.

(21) Appl. No.: 15/578,574

(22) PCT Filed: Jun. 1, 2016

(86) PCT No.: PCT/US2016/035158
§ 371 (c)(1),
(2) Date: Nov. 30, 2017

(87) PCT Pub. No.: WO2016/196551
PCT Pub. Date: Dec. 8, 2016

(65) Prior Publication Data
US 2018/0139839 A1    May 17, 2018

Related U.S. Application Data

(60) Provisional application No. 62/170,245, filed on Jun. 3, 2015.

(51) Int. Cl.
*H05K 1/02* (2006.01)
*H01P 11/00* (2006.01)
(Continued)

(52) U.S. Cl.
CPC ..... *H05K 1/0245* (2013.01); *H01L 23/49838* (2013.01); *H01L 23/49894* (2013.01);
(Continued)

(58) Field of Classification Search
CPC ....... H05K 1/0248; H01P 1/0245; H01P 3/04; H01P 3/026; H01P 11/003
(Continued)

(56) References Cited

U.S. PATENT DOCUMENTS 6,891,260 B1    5/2005  Mora et al.
7,453,143 B2   11/2008  Dutta
(Continued)

FOREIGN PATENT DOCUMENTS

WO    WO 2016/196551 A1    12/2016

OTHER PUBLICATIONS

International Search Report and Written Opinion for International Application No. PCT/US2016/35158 dated Sep. 7, 2016.
(Continued)

*Primary Examiner* — Benny T Lee
(74) *Attorney, Agent, or Firm* — Wolf, Greenfield & Sacks, P.C.

(57) ABSTRACT

Disclosed herein is a method. A first electrically conductive trace is provided on a substrate. A second electrically conductive trace is providing on the substrate proximate the first electrically conductive trace. A solder mask is provided at the first and the second electrically conductive traces. A portion of the first electrically conductive trace is free of any portion of the solder mask covering thereon.

26 Claims, 4 Drawing Sheets

(51) Int. Cl.
  *H01L 23/498* (2006.01)
  *H01P 3/08* (2006.01)
  *H05K 3/10* (2006.01)
  *H05K 3/28* (2006.01)
  *H05K 3/34* (2006.01)
(52) U.S. Cl.
  CPC ............ *H01P 3/081* (2013.01); *H01P 11/003* (2013.01); *H05K 1/0248* (2013.01); *H05K 3/10* (2013.01); *H05K 3/28* (2013.01); *H05K 3/3452* (2013.01); *H05K 2201/0989* (2013.01)
(58) Field of Classification Search
  USPC ........................................................ 333/4, 5
  See application file for complete search history.

(56) References Cited

U.S. PATENT DOCUMENTS

2010/0237961 A1* 9/2010 Pai et al. ............... H05K 1/024
   333/4
2015/0004748 A1   1/2015 Shin et al.

OTHER PUBLICATIONS

International Preliminary Report on Patentability for International Application No. PCT/US2016/35158 dated Dec. 14, 2017.

* cited by examiner

US 10,375,823 B2

DIFFERENTIAL SIGNAL TRACES INCLUDING A SOLDER MASK DISPOSED THEREON

CROSS-REFERENCE TO RELATED APPLICATIONS

This application is a National Phase Entry of international PCT patent application No. PCT/US2016/035158, entitled "DIFFERENTIAL SIGNAL TRACES" filed on Jun. 1, 2016, which claims priority to and the benefit of U.S. Provisional Application Ser. No. 62/170,245, entitled "DIFFERENTIAL SIGNAL TRACES" filed on Jun. 3, 2015. The entire contents of these applications are incorporated herein by reference in their entirety.

BACKGROUND

Technical Field

The exemplary and non-limiting embodiments relate generally to a printed wiring board and, more particularly, to differential traces on a printed wiring board.

Brief Description of Prior Developments

Differential signaling is a method for electrically transmitting information using two complementary signals. The technique sends the same electrical signal as a differential pair of signals; each in its own electrical conductor. Electrical conductive traces on a printed wiring board (PWB) (also known as a printed circuit board (PCB)) have been provided in some instances as a pair of differential traces for differential signals. Traces on a PWB often change direction to traverse a path between opposite ends of the traces without contacting other traces. The differential traces are, thus, skewed along their length relative to each other. For a pair of differential traces on a PWB, this can cause the physical length of the differential traces to be different and, thus, cause the timing of delivery of the complementary differential signals to be offset or skewed relative to one another. Skew, a difference in electrical timing of signals in a differential pair of conductors, is often caused by a physical length difference in the differential pair of conductors relative to each another. It is known that signal integrity performance in a channel can be detrimentally affected when there is intrapair, (i.e. in-pair) skew.

SUMMARY OF THE INVENTION

In accordance with one aspect a method is disclosed. A first electrically conductive trace is provided on a substrate. A second electrically conductive trace is providing on the substrate proximate the first electrically conductive trace. A solder mask is provided at the first and the second electrically conductive traces. A portion of the first electrically conductive trace is free of any portion of the solder mask covering thereon.

In accordance with another aspect a printed circuit board is disclosed. The printed circuit board includes a substrate, a first electrically conductive trace, a second electrically conductive trace, and a solder mask. The first electrically conductive trace is on the substrate. The second electrically conductive trace is on the substrate proximate the first electrically conductive trace. The solder mask is at the first and the second electrically conductive traces. The solder mask covers a length of the second electrically conductive trace. The solder mask does not cover an adjacent length of the first electrically conductive trace.

BRIEF DESCRIPTION OF THE DRAWINGS

The foregoing aspects and other features of the invention are explained in the following description, taken in connection with the accompanying drawings, wherein.

DETAILED DESCRIPTION OF THE INVENTION

Figure 1:
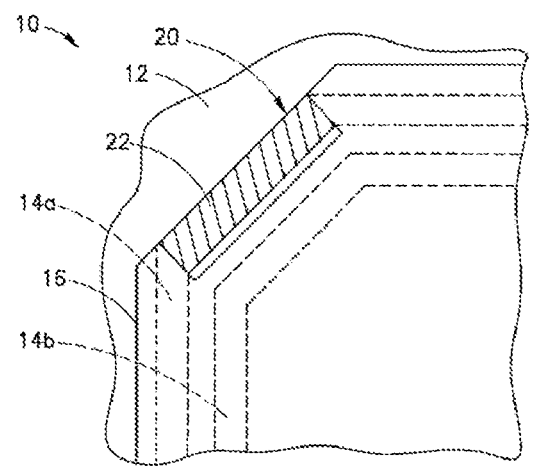
FIG. 1 is a top view of a portion of a printed wiring board incorporating features of an example embodiment.

This section provides information that may be useful in understanding the invention, which is defined by the claims and may not limited to the specifics of the embodiments described in this section. Referring to FIG. 1, there is shown a top view of a portion of a printed wiring board (PWB) 10 incorporating features of an example embodiment. Although the features will be described with reference to the example embodiment shown in the drawings, it should be understood that features can be embodied in many alternate forms of embodiments. In addition, any suitable size, shape or type of elements or materials could be used.

Figure 2:
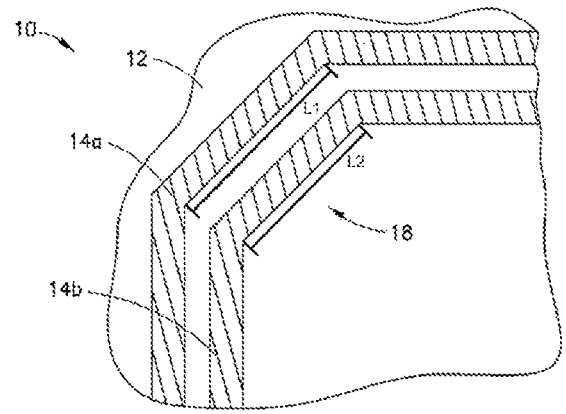
FIG. 2 is a top view of the printed wiring board of FIG. 1 shown without the solder mask.

The PWB 10 comprises a substrate 12, electrically conductive traces 14a, 14b, and a solder mask 16. A portion of the solder mask 16 is not provided over electrically conductive trace 14a at area 20, thus leaving portion 22 of the electrically conductive trace 14a is not covered by the solder mask 16. The PWB 10 may comprise other components or layers (not shown). Referring also to FIG. 2, the PWB 10 comprising a substrate 12 is shown without the solder mask 16 of FIG. 1. The two traces 14a, 14b are differential pair traces for differential signaling. As can be seen, the traces 14a, 14b are equally spaced from each other along their length. However, because the two traces 14a, 14b have a turn or bend 18, the physical length L1 of the first trace 14a is longer than the physical length L2 of the second trace 14b. In this example the bend is about 90 degrees (formed by two 45 degree bends). However, features as described herein could be used for any bend or turn in the traces as should be further understood from the description below. Due to the two 45 degree bends, the traces 14a, 14b are, thus, slightly skewed relative to one another; portions of the traces do not intersect, but are not perfectly parallel.

A solder mask is a thin lacquer-like layer of polymer that is usually applied to the traces of a printed wiring board (PWB) for protection against oxidation and to prevent solder bridges from forming between closely spaced solder pads. Once applied, openings may be made in the solder mask wherever components are soldered, which may be accomplished using photolithography for example.

Figure 3:
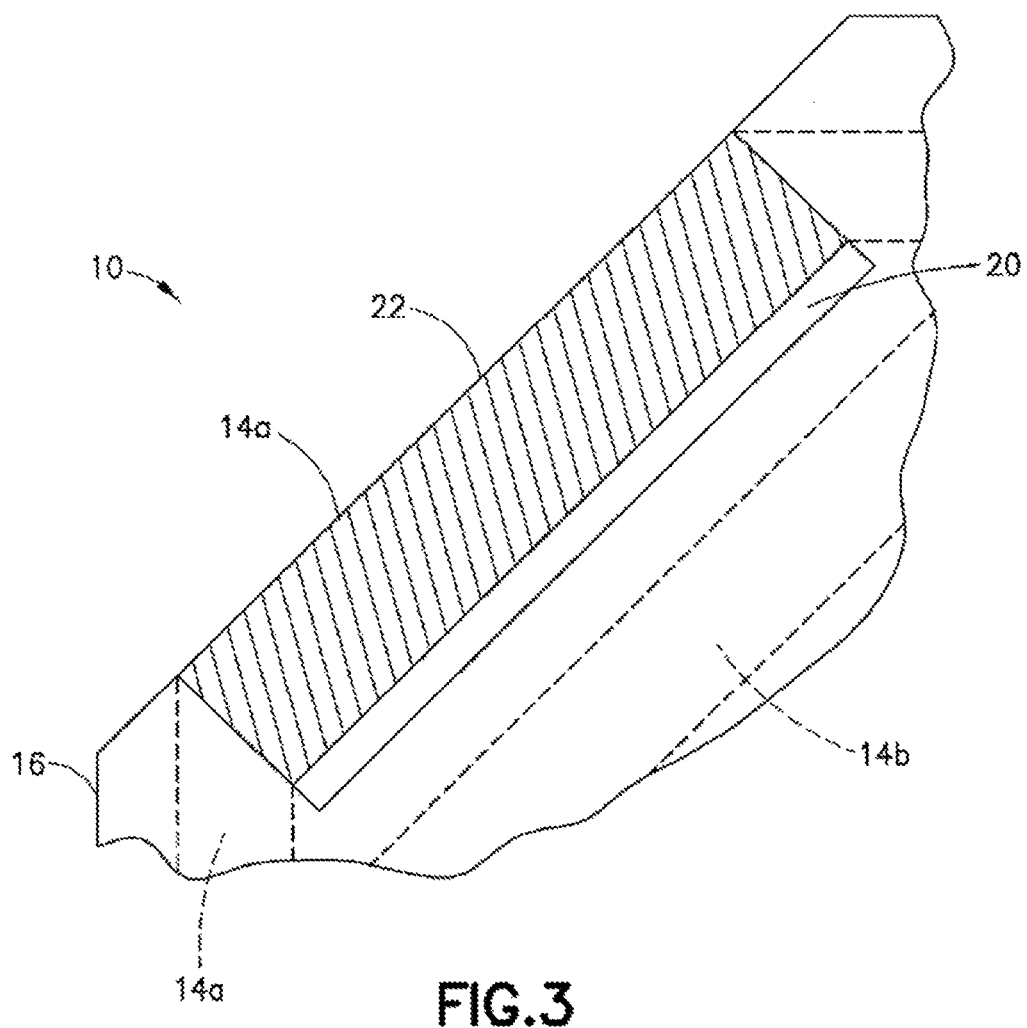
FIG. 3 is an enlarged view of a portion of the printed wiring board shown in FIG. 1.

Referring also to FIG. 3, the solder mask 16 applied to the printed wiring board 10 covers both of the traces 14a, 14b. However, a portion of the solder mask 16 is not provided over a length of the longer trace 14a at area 20. Thus, portion 22 of the first trace 14a is not covered by the solder mask 16 at the bend 18. This configuration may be formed by applying solder mask 16 to printed wiring board 10 so that it covers area 20 and then removing the solder mask at area 20 to expose portion 22. Alternatively, this configuration may be formed by temporarily masking area 20 when the solder mask 16 is applied over the substrate 12 and traces 14a, 14b.

Not having the solder mask on the trace 14a at area 20 changes the electrical length of the trace 14a. This does not change the physical length of the trace 14a; only the effective electrical length of the trace 14a. An electrical signal can travel faster along the portion 22 (which does not have the solder mask thereon) than the rest of the trace 14a (which has the solder mask thereon). This can be used to reduce or eliminating skew within a differential pair by modifying half of the pair. This is accomplished by controlling placement of solder mask over the differential traces.

Removing the solder mask, or otherwise not providing the solder mask, on a portion of one of the pair of differential traces allows the traces to have different effective dielectrics over a small segment of the path. In this example, this creates an air void in the solder mask of a PWB. The void is positioned over an electrically longer trace of the differential pair on a PWB. This adds an air void to an electrically longer trace to correct for skew in differential signal traces on a PWB.

Air is just one example of a dielectric that can be used to speed up the signal in the longer differential signal trace so that there is little or no skew. With features as described herein, even though the traces 14a, 14b have different physical lengths, there is no skew in the differential pair. With features as described herein, the solder mask may be added selectively to PWB traces to manage skew. The above described features may be used for reducing in-pair skew of differential-mode microstrip traces on a PWB. Virtually all printed wiring boards that entail differential microstrip traces must negotiate a bend. Features as described herein may be used to correct for the resultant different physical lengths and, thus, align differential signaling in the pair of traces regardless of different physical lengths.

When traces are routed differentially, care is generally exercised to match the physical length of the constituent traces. Sometimes this is not possible when the trace routing must negotiate a bend. In the case of micro strip, when it is not possible to match the physical length, it is still possible to match the electrical length of the traces by placing solder mask over the shorter trace and specifically not placing solder mask over a limited portion of the longer trace. The resultant electrical length of the longer trace can be tuned to cancel the in-pair skew between the two traces.

With features as described herein, signal integrity performance when there is intrapair, (i.e. in-pair) skew will not be detrimentally affected. Thus, features as described herein may be used to prevent differential pair skew owing to longer physical length of one of the traces. Skew may be reduced or cancelled by using well thought-out, selectively configured placement of the solder mask to better match the electrical length of the traces.

It should be understood that components of the invention can be operationally coupled or connected and that any number or combination of intervening elements can exist (including no intervening elements). The connections can be direct or indirect and additionally there can merely be a functional relationship between components.

Below are provided further descriptions of various non-limiting, exemplary embodiments. The below-described exemplary embodiments may be practiced in conjunction with one or more other aspects or exemplary embodiments.

That is, the exemplary embodiments of the invention, such as those described immediately below, may be implemented, practiced or utilized in any combination (e.g., any combination that is suitable, practicable and/or feasible) and are not limited only to those combinations described herein and/or included in the appended claims.

In one exemplary embodiment, a method comprising: providing a first electrically conductive trace on a substrate; providing a second electrically conductive trace on the substrate proximate the first electrically conductive trace; and providing a solder mask at the first and the second electrically conductive traces, wherein a portion of the first electrically conductive trace is free of any portion of the solder mask covering thereon.

A method as described above wherein the providing of the solder mask further comprises covering the first and the second electrically conductive traces including the portion of the first electrically conductive trace and subsequently removing the solder mask from the portion of the first electrically conductive trace.

A method as described above wherein the providing of the solder mask further comprises temporarily masking the portion of the first electrically conductive trace when the solder mask is applied over the substrate.

A method as described above wherein the first electrically conductive trace comprises a longer length than the second electrically conductive trace.

A method as described above wherein the first electrically conductive trace and the second electrically conductive trace each comprise a bend or turn.

A method as described above wherein the substrate is a printed circuit board substrate.

A method as described above wherein the first and the second electrically conductive traces are differential pair traces configured for differential signaling.

A method as described above wherein the portion of the first electrically conductive trace comprises a first effective dielectric over the portion and wherein the second electrically conductive trace comprises a second different effective dielectric over the second electrically conductive trace.

A method as described above wherein the first effective dielectric is an air void.

Figure 4:
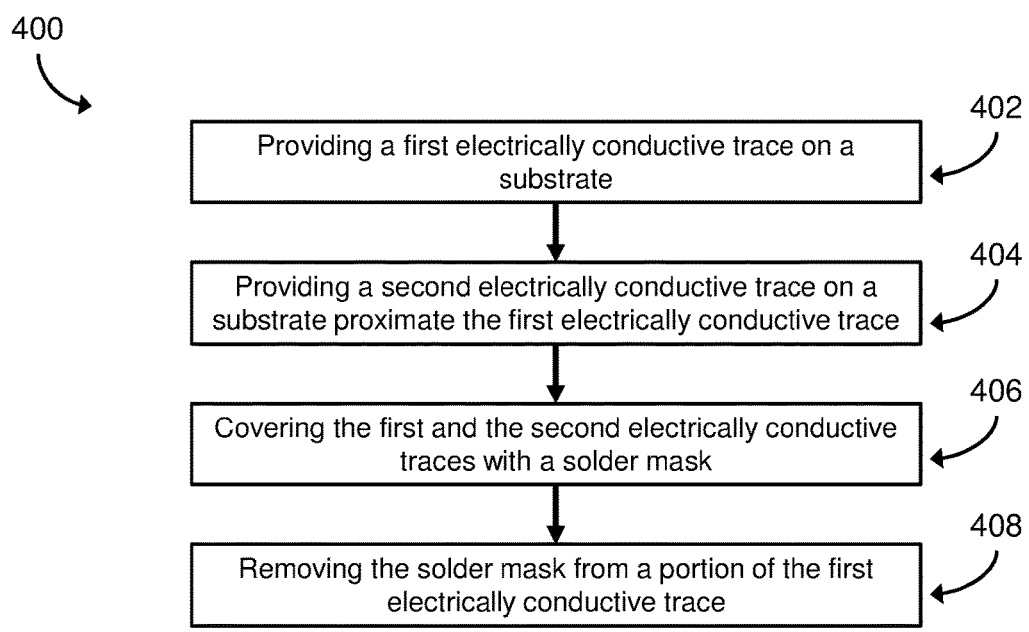
FIG. 4 is an exemplary method of fabricating the printed wiring board of FIG. 1.

A method of fabrication, as described above, is illustrated by process 400 of FIG. 4. In step 402, a first electrically conductive trace 14a may be provided on a substrate 12, and in step 404 a second electrically conductive trace 14b may be provided on a substrate 12 proximate the first electrically conductive trace 14a. In step 406, the first and the second electrically conductive traces 14a, 14b may be covered with a solder mask 16, and in step 408 the solder mask 16 may be removed from a portion 20 of the first electrically conductive trace 14a.

Figure 5:
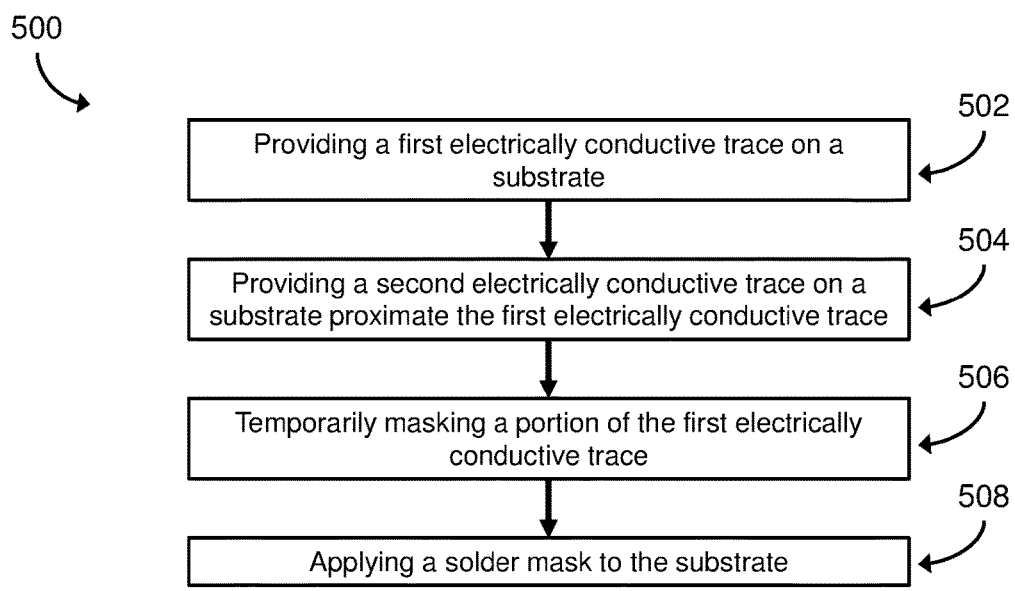
FIG. 5 is an exemplary method of fabricating the printed wiring board of FIG. 1.

A method of fabrication, as described above, is illustrated by process 500 of FIG. 5. In step 502, a first electrically conductive trace 14a may be provided on a substrate 12, and in step 504 a second electrically conductive trace 14b may be provided on a substrate 12 proximate the first electrically conductive trace 14a. In step 506, a temporary mask may be applied to an area 20 of the first electrically conductive trace 14a. In step 508, the substrate 12 may be covered with a solder mask 16.

In another exemplary embodiment, a printed circuit board comprising: a substrate; a first electrically conductive trace on the substrate; a second electrically conductive trace on the substrate proximate the first electrically conductive trace; and a solder mask at the first and the second electrically conductive traces, wherein the solder mask covers a length of the second electrically conductive trace, and wherein the solder mask does not cover an adjacent length of the first electrically conductive trace.

A printed circuit board as described above wherein an effective dielectric covers the length of the second electrically conductive trace, and wherein another different effective dielectric covers the adjacent length of the first electrically conductive trace.

A printed circuit board as described above wherein an air void covers the adjacent length of the first electrically conductive trace.

A printed circuit board as described above wherein the adjacent length of the first electrically conductive trace comprises a longer physical length than the physical length of the second electrically conductive trace.

A printed circuit board as described above wherein the first electrically conductive trace and the second electrically conductive trace comprise substantially equal effective electrical lengths.

A printed circuit board as described above wherein the first and the second electrically conductive traces are differential pair traces configured for differential signaling.

A printed circuit board as described above wherein the printed circuit board is configured to reduce skew between the differential pair traces.

A printed circuit board as described above wherein the solder mask covers a majority of the first and the second electrically conductive traces.

A printed circuit board as described above wherein the first electrically conductive trace and the second electrically conductive trace each comprise a bend or turn.

A printed circuit board as described above wherein the first electrically conductive trace and the second electrically conductive trace are substantially parallel to each other.

A printed circuit board as described above wherein the printed circuit board is configured such that an electrical signal can travel faster along the adjacent length of the first electrically conductive trace than the length of the second electrically conductive trace.

It should be understood that the foregoing description is only illustrative. Various alternatives and modifications can be devised by those skilled in the art. For example, features from different embodiments described above could be selectively combined into a new embodiment. Accordingly, the description is intended to embrace all such alternatives, modifications and variances which fall within the scope of the appended claims.

What is claimed is:

1. A method comprising:
   providing a first electrically conductive trace on a substrate;
   providing a second electrically conductive trace on the substrate proximate the first electrically conductive trace; and
   providing a solder mask at the first and the second electrically conductive traces, wherein a portion of the first electrically conductive trace is free of any portion of the solder mask covering thereon and wherein:
   the providing of the solder mask further comprises covering the first and the second electrically conductive traces including the portion of the first electrically conductive trace and subsequently removing the solder mask from the portion of the first electrically conductive trace.

2. A method as in claim 1 wherein the first electrically conductive trace and the second electrically conductive trace each comprise a bend or turn.

3. A method as in claim 2 wherein the portion of the first electrically conductive trace free of any portion of the solder mask is disposed at the bend of the first electrically conductive trace.

4. A method as in claim 1 wherein the first electrically conductive trace comprises a longer length than the second electrically conductive trace.

5. A method as in claim 1 wherein, after removing the solder mask,
   the portion of the first electrically conductive trace comprises a first dielectric different than the solder mask over the portion and wherein the second electrically conductive trace comprises the solder mask comprising a second different dielectric over the second electrically conductive trace.

6. A method as in claim 5 wherein the first dielectric is an air void.

7. A method as in claim 1 wherein the first and the second electrically conductive traces are differential pair traces configured for differential signaling.

8. A method as in claim 1 wherein the substrate is a printed circuit board substrate.

9. A printed circuit board comprising:
   a substrate;
   a first electrically conductive trace on the substrate;
   a second electrically conductive trace on the substrate proximate the first electrically conductive trace; and
   a solder mask at the first and the second electrically conductive traces, wherein the solder mask covers a length of the second electrically conductive trace, and wherein the solder mask does not cover an adjacent length of the first electrically conductive trace, and wherein the solder mask covers a majority of the first and the second electrically conductive traces.

10. A printed circuit board as in claim 9 wherein the printed circuit board is configured such that an electrical signal can travel faster along the adjacent length of the first electrically conductive trace than the length of the second electrically conductive trace.

11. A printed circuit board as in claim 9 wherein a dielectric identical to the solder mask covers the length of the second electrically conductive trace, and wherein a dielectric different than the solder mask covers the adjacent length of the first electrically conductive trace.

12. A printed circuit board as in claim 9 wherein an air void covers the adjacent length of the first electrically conductive trace.

13. A printed circuit board as in claim 9 wherein the adjacent length of the first electrically conductive trace comprises a longer physical length than the physical length of the second electrically conductive trace.

14. A printed circuit board as in claim 13 wherein the first electrically conductive trace and the second electrically conductive trace comprise substantially equal effective electrical lengths.

15. A printed circuit board as in claim 9 wherein the first and the second electrically conductive traces are differential pair traces configured for differential signaling.

16. A printed circuit board as in claim 15 wherein the printed circuit board is configured to reduce skew between the differential pair traces.

17. A printed circuit board as in claim 9 wherein the first electrically conductive trace and the second electrically conductive trace are substantially parallel to each other.

18. A printed circuit board as in claim 9 wherein the first electrically conductive trace and the second electrically conductive trace each comprise a bend or turn.

19. A method comprising:
providing a first electrically conductive trace on a substrate;
providing a second electrically conductive trace on the substrate proximate the first electrically conductive trace; and
providing a solder mask at the first and the second electrically conductive traces, wherein a portion of the first electrically conductive trace is free of any portion of the solder mask covering thereon and wherein:
the providing of the solder mask further comprises temporarily masking the portion of the first electrically conductive trace when the solder mask is applied over the substrate.

20. A method as in claim 19 wherein, after temporarily masking the portion of the first electrically conductive trace, the portion of the first electrically conductive trace comprises a first dielectric different than the solder mask over the portion and wherein the second electrically conductive trace comprises the solder mask comprising a second different dielectric over the second electrically conductive trace.

21. A method as in claim 20 wherein the first dielectric is an air void.

22. A method as in claim 19 wherein the first electrically conductive trace comprises a longer length than the second electrically conductive trace.

23. A method as in claim 19 wherein the first electrically conductive trace and the second electrically conductive trace each comprise a bend or turn.

24. A method as in claim 23 wherein the portion of the first electrically conductive trace free of any portion of the solder mask is disposed at the bend of the first electrically conductive trace.

25. A method as in claim 19 wherein the substrate is a printed circuit board substrate.

26. A method as in claim 19 wherein the first and the second electrically conductive traces are differential pair traces configured for differential signaling.

* * * * *